United States Patent
Shiraiwa et al.

(10) Patent No.: US 8,624,122 B2
(45) Date of Patent: Jan. 7, 2014

(54) CIRCUIT BOARD STRUCTURE HAVING MEASURES AGAINST HEAT

(75) Inventors: Hiroki Shiraiwa, Shizuoka (JP);
Kazuomi Kiyosue, Shizuoka (JP);
Akinori Nakashima, Shizuoka (JP);
Tomohiro Sugiura, Shizuoka (JP);
Noriyoshi Yamazaki, Shizuoka (JP);
Minoru Umezaki, Shizuoka (JP)

(73) Assignee: Yazaki Corporation, Tokyo (JP)

( * ) Notice: Subject to any disclaimer, the term of this patent is extended or adjusted under 35 U.S.C. 154(b) by 459 days.

(21) Appl. No.: 12/735,193

(22) PCT Filed: Dec. 12, 2008

(86) PCT No.: PCT/JP2008/072660
§ 371 (c)(1),
(2), (4) Date: Jun. 21, 2010

(87) PCT Pub. No.: WO2009/081769
PCT Pub. Date: Jul. 2, 2009

(65) Prior Publication Data
US 2010/0263915 A1 Oct. 21, 2010

(30) Foreign Application Priority Data
Dec. 21, 2007 (JP) ................................. 2007-329993

(51) Int. Cl.
*H05K 1/00* (2006.01)
(52) U.S. Cl.
USPC ............ 174/252; 174/250; 361/704; 361/712
(58) Field of Classification Search
USPC .................. 174/252, 250; 361/704, 712–713; 439/76.1
See application file for complete search history.

(56) References Cited

U.S. PATENT DOCUMENTS

| 6,587,346 B1 | 7/2003 | Parker | |
| 7,074,053 B2 * | 7/2006 | Kawakita et al. | 439/76.1 |
| 2007/0279870 A1 * | 12/2007 | Sato et al. | 361/704 |

FOREIGN PATENT DOCUMENTS

JP 2006-042583 A 2/2006
(Continued)

OTHER PUBLICATIONS

Supplementary European Search Report for EuropeanPatent Application No. 08864352.3 issued Dec. 20, 2010.

(Continued)

*Primary Examiner* — Timothy Thompson
*Assistant Examiner* — Andargie M Aychillhum
(74) *Attorney, Agent, or Firm* — Edwards Wildman Palmer LLP; James E. Armstrong, IV; Stephen D. LeBarron

(57) ABSTRACT

To achieve efficient heat spreading and heat releasing by using a metal core of a circuit board, a terminal block includes an insulating block body and terminals. At least one of the terminals is provided with terminal portions for a connection with a circuit board. The terminal portions are inserted into respective through holes of the circuit board, the circuit board having a pattern circuit at a surface layer thereof and a conductive metal core at an intermediate portion in a thickness direction, so that heat of the metal core or of both the metal core and the pattern circuit is absorbed and transferred to the terminals. A bus-bar block includes an insulating block body and several parallel bus-bars with different lengths. Terminal portions at a tip end of the bus-bars are inserted, near heat-generating component on the circuit board, into the through holes of the circuit board.

3 Claims, 5 Drawing Sheets

(56) References Cited

FOREIGN PATENT DOCUMENTS

| | | |
|---|---|---|
| JP | 2006-187123 A | 7/2006 |
| JP | 2006-333583 A | 12/2006 |
| JP | 2007-109993 A | 4/2007 |
| JP | 2007-305399 A | 11/2007 |

OTHER PUBLICATIONS

International Search Report dated Feb. 10, 2009, issued on PCT/JP2008/072660.

Examination Report dated Dec. 21, 2012 for European Application No. 08 864 352.3.

* cited by examiner

CIRCUIT BOARD STRUCTURE HAVING MEASURES AGAINST HEAT

FIELD OF THE INVENTION

The present invention relates to a circuit board structure having measures against heat which can absorb heat of a circuit board, via terminals and bus bars, from a metal core provided at an intermediate layer of the circuit board and also from a pattern circuit provided at a surface layer of the circuit board, spreading the heat as well as releasing the heat to an external environment.

DESCRIPTION OF THE RELATED ART

FIG. 8 and FIG. 9 show one embodiment of a conventional circuit board assembly (refer to Patent Literature 1).

As shown in FIG. 8, a circuit board assembly 71 includes a circuit board 73 having a printed circuit 81 (FIG. 9) and a copper-plate metal core 82 (FIG. 9) at an intermediate portion in a thickness direction, a various electric and electronic components 72 mounted on a surface of the circuit board 73, connector blocks 75 each connected to both ends of the circuit board 73 via terminals 74, and a fuse block 77 connected to an anterior portion of the circuit board 73 via terminals 76.

The circuit board 73, the electric and electronic components 72 and the respective blocks 75, 77 are covered with and protected by an upper and a lower cover (not shown) so as to expose openings 75a, 77a of the respective blocks 75, 77, forming a junction block with the respective components 72 through 77 and the above-described covers.

The electric and electronic components 72 connected to the circuit board include switching transistors $72_1$ and an integrated circuit $72_2$. As shown in FIG. 9 as an example, most of the electric and electronic components 72 and the terminals 74 of the connector blocks 75 are soldered to the printed circuit 81 adjacent to the surface of the circuit board 73, while some of the terminals 76 of the fuse block 77 are connected to the metal core 82 of the circuit board 73.

In FIG. 9, insulating resin layers indicated by a reference sign 85 are arranged to sandwich the metal core 82 from above and below. Reference signs 83 and 84 indicate through holes into which the respective terminals 74, 76 are inserted. An inner surface of each of the through holes 83, 84 is coated with a conductive coating, and the conductive coating is connected to the printed circuit 81 and the metal core 82.

The connector block 75 includes: a connector housing (indicated also by a reference sign 75) made of an insulating resin; and the respective L-shaped pin-like terminals 74 arranged in parallel with respect to each other. One end of the respective terminals 74 is inserted into the connector housing, and the other end thereof is inserted into and soldered to the through hole 83 (FIG. 9) of the circuit board 73.

The fuse block 77 includes: a fuse holder (a block main body) 78 made of an insulating resin; the respective L-shaped plate-like terminals (bus bars) 76 arranged in parallel with respect to each other, in which one end thereof is inserted into the fuse holder 78, and the other end thereof is inserted into and soldered to the through hole 84 (FIG. 9) of the circuit board 73; comb-like bus bars (not shown) made of a conductive metal inserted into the fuse holder 78; and a power input connector 80 receiving one end of the comb-like bus bar.

A plurality of blade-like fuses (not shown) are to be connected to the fuse holder 78 in two columns in a vertical direction in parallel in a horizontal direction. U-shaped terminals (holding terminals) of the upper-and-lower pair of the terminals 76 and of the upper-and-lower pair of the bus bars are inserted into upper and lower rooms 77a, correspondingly with respect to an upper-and-lower pair of terminals of the fuse. A battery power or an alternator power is to be inputted to the connector 80.

The above-mentioned Patent Literature 1 also discloses an exemplary structure in which another terminal holder (not shown) is connected to the fuse holder 78 to receive therein the L-shaped terminals 76 of the respective columns (thus, the bus bars are replaced with the terminals).

Furthermore, Patent Literature 2 discloses using a circuit board including a metal core having high heat-releasing property and applying a small-sized fuse and a medium current fuse. Patent Literature 3 discloses band-shaped metallic bus bars arranged in an opposed manner with respect to a switching device on a circuit board and vertically on the circuit board, to absorb the heat generated at the switching device via the bus bars to improve the heat releasing property of a power dividing unit. It is also known to form a metal core with an aluminum plate rather than a copper plate.

[Patent Literature 1] Japanese Patent Application Publication No. 2006-333583 (FIG. 6, FIG. 1 to FIG. 2)

[Patent Literature 2] Japanese Patent Application Publication No. 2006-42583 (FIG. 1)

[Patent Literature 3] Japanese Patent Application Publication No. 2006-187123 (FIG. 5)

SUMMARY OF THE INVENTION

Technical Problem

For the conventional circuit board assembly 71 shown in FIG. 7, the metal core 82 has a good heat-releasing (heat-spreading) property. However, when a certain kind of the electric and electronic components 72 (for example relays) are applied, the circuit board 73 is deformed due to heating. There is also a concern that this heating may be enhanced when applying fuses arranged in several columns.

For the above-described reasons, applying for example the structure of Patent Literature 3 has a problem that a wiring space for the bus bars and an installation space for the electric and electronic components are limited. There is also a problem of the structure being large since the bus bars need to be wired along detour paths.

In view of the above-described problems, an object of the present invention is to provide a circuit board structure having measures against heat which can perform efficient heat spreading and heat releasing by utilizing a metal core, which can efficiently spread and release heat generated at heat-generating components, and which can securely spread and release heat of the circuit board even upon applying fuses and such arranged in a plurality of columns.

Solution to Problem

In order to solve the above-described problems and achieve the above-described object, a first aspect of the present invention provides a circuit board structure having measures against heat, including a terminal block having an insulating block main body and a plurality of terminals, in which least one of the terminals is provided with a plurality of terminal portions for a connection with a circuit board, in which the plurality of terminal portions are inserted into respective through holes of the circuit board, the circuit board having a conductive metal core at an intermediate portion in a thickness direction of the circuit board, and in which heat of the metal core is absorbed and transferred to the terminals by the plurality of terminal portions.

According to the above-described structure, heat of the circuit board is absorbed from the metal core by the plurality of terminal portions of the terminals and transferred efficiently to the terminals (not to the terminal portions but to the terminal body), spreading and releasing the heat. The heat of the terminal body is released for example by radiation or by conduction to the block main body. Thus, by increasing connection points of the terminals at which the terminals connect with the metal core, efficient heat absorption can be performed. The plurality of terminal portions may be arranged to contact with an inner surface of the respective through holes of the metal core either directly or indirectly via solder. The plurality of terminals is provide with terminal portions for a connection with a circuit board at one end thereof and terminal portions for a connection with electric components, such as fuses, at the other end thereof.

As a second aspect of the present invention, the at least one of the terminals is provided with a terminal portion for a connection with an electric wire, so that the heat is transferred from the terminal portion to the electric wire.

According to the above-described structure, the heat absorbed from the circuit board by the terminals can continuously and efficiently be transferred to the electric wire at an external environment via the terminal portion for the connection with an electric wire. The heat of the electric wire is absorbed along a longitudinal direction of the electric wire, or is radiated to the external environment from an outer circumference of the electric wire. As a result, a rise in temperature of the circuit board can securely be prevented.

As a third aspect of the present invention, there is provide with a circuit board structure having measures against heat, including a bus bar block having an insulating block main body and a plurality of bus bars arranged in parallel, in which the bus bars are arranged to have various lengths, in which respective terminal portions at a tip end of the respective plurality of bus bars having the various lengths are inserted into respective through holes of a circuit board, the circuit board having a pattern circuit at a surface layer thereof and a conductive metal core at an intermediate layer in a thickness direction of the circuit board, and in which wherein heat of the metal core or heat of both of the metal core and the pattern circuit is absorbed and transferred to the bus bars via the respective terminal portions.

According to the above-described structure, the terminal portions at the tip end of the respective bus bars are disposed on the circuit board over a wide area of the circuit board. Consequently, the heat at several sites on the circuit board can efficiently be absorbed and spread by the respective bus bars through the broad metal core or through both of the broad metal core and the pattern circuit at the surface layer. Then the heat is released to the external environment from the respective bus bars via radiation or via conduction to the block main body. The terminal portions of the bus bars may be arranged to contact with an inner surface of the respective through holes of the metal core either directly or indirectly via solder. The terminal portion may contact with both of the metal core and the pattern circuit within one through hole. Each of the bus bars is provide with a terminal portion for a connection with a circuit board at one end thereof and a terminal portion for a connection with electric components, such as fuses, at the other end thereof.

As a fourth aspect of the present invention, there is provide with a circuit board structure having measures against heat, including a bus bar block having an insulating block main body and a plurality of bus bars arranged in parallel, in which a plurality of heat-generating components are mounted to a circuit board, the circuit board having a pattern circuit at a surface layer thereof and a conductive metal core at an intermediate layer in a thickness direction of the circuit board, in which terminal portion at a tip end of the respective plurality of bus bars are inserted into respective through holes of the circuit board so as to be arranged nearby the heat-generating component, and in which heat of the metal core or heat of both of the metal core and the pattern circuit is absorbed and transferred to the bus bars via the terminal portions.

According to the above-described structure, the heat of the heat-generating components such as relays can efficiently be absorbed and spread by the terminal portions of the bus bars through the metal core or through both of the metal core and the pattern circuit. Then the heat can be released from bus bars via radiation to the external environment or via conduction to the block main body. The terminal portion of the bus bar may be arranged to contact with an inner surface of the through hole of the metal core and an inner surface of the through hole of the pattern circuit, either directly or indirectly via solder. The terminal portion may contact with both of the metal core and the pattern circuit within one through hole. Each of the bus bars is provide with a terminal portion for a connection with a circuit board at one end thereof and a terminal portion for a connection with electric components, such as fuses, at the other end thereof.

As a fifth aspect of the present invention, in the circuit board structure having measures against heat according to the third or fourth aspect, a length of the bus bars, the length to the tip-end of the bus bar, is arranged longer than a length of the block main body, so that the bus bars are arranged to project outward from and far from the block main body.

According to the above-described structure, since the bus bars are arranged to project from and largely expose outside of an edge of the block main body, the heat releasing property (property of radiation to outside) is improved. Consequently, the heat of the metal core and the pattern circuit can efficiently be absorbed and diffused by the terminal portions of the bus bars.

As a sixth aspect of the present invention, the circuit board structure having measures against heat according to any one of the third through fifth aspects includes the circuit board structure having measures against heat according to the first or the second aspect, in which the circuit board is provided with the terminal block on a surface thereof, and in which the bus bar block is disposed on the terminal block, so that the terminal portions for the connection with electric components of the terminals and of the bus bars are arranged in a plurality of columns.

According to the above-described structure, the electric components such as fuses are to be arranged in the plurality of columns (multiple columns) and connected to the terminal portions for the connection with electric components of the respective terminals of the lower terminal block as well as to the terminal portions for the connection with electric components of the respective bus bars of the upper bus bar block. Consequently, the heat of the metal core and the pattern circuit of the circuit board can efficiently be absorbed by both of the terminals and the bus bars.

As a seventh aspect, in the circuit board structure having measures against heat according to any one of the first through the sixth aspects, the block main body is made of a resin material having high thermal conductivity.

According to the above-described structure, the heat of the metal core and the pattern circuit, which is absorbed by the respective terminal portions for a connection with a circuit board of the terminals and of the bus bars, can securely be absorbed by the respective block main bodies of the terminal block and/or the bus bar block having high thermal conductivity and then efficiently released to the external environment. Consequently, the heat of the circuit board can be absorbed and spread continuously by the terminals and the bus bars.

Advantageous Effects of the Invention

According to the first aspect of the present invention there is provided with the increased connection points of the terminals connecting with the metal core. As a result, the heat of the circuit board is efficiently absorbed by the terminals, securely preventing a heating (an excessive rise in a temperature) of the circuit board with a simple structure.

According to the second aspect of the present invention, the heat absorbed from the circuit board is transferred from the terminal portion to the electric wire. As a result, the heat can be continuously absorbed via the terminals, further preventing the heating of the circuit board.

According to the third aspect of the present invention, the heat of the metal core or of both of the metal core and the pattern circuit is absorbed over a wide area of the circuit board via the plurality of the terminal portions. As a result, the heat of the circuit board can efficiently be equalized and released, securely preventing the heating of the circuit board.

According to the fourth aspect of the present invention, the heat of the heat-generating components such as relays on the circuit board is absorbed from the metal core or from the metal core and the pattern circuit directly by the terminal portions of the bus bars. As a result, the heating of the relays and the heating of the circuit board caused thereby can securely be prevented.

According to the fifth aspect of the present invention, since the heat absorbed from the metal core and the pattern circuit is released efficiently via the bus bars itself, the heating of the circuit board can further be prevented.

According to the sixth aspect of the present invention, even in a case of applying the electric components such as fuses arranged in several columns (multiple columns), the heat of the circuit board can efficiently be equalized and released by utilizing both of the terminals and the bus bars.

According to the seventh aspect of the present invention, the heat of the metal core and the pattern circuit is securely transferred from the terminals and the bus bars to the block main body and is then radiated efficiently from the block main body to the external environment. As a result, the heat absorption at the circuit board can be performed continuously by the terminals and the bus bars, further preventing the heating of the circuit board.

Figure 1:
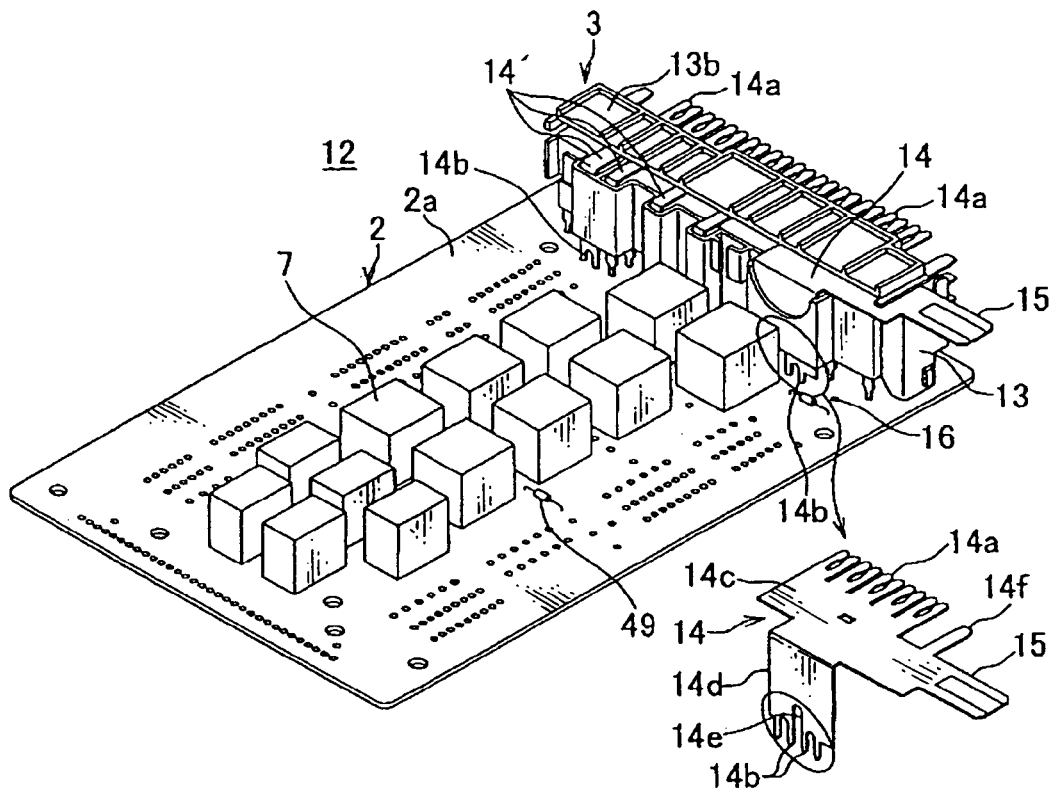
FIG. 1 is a perspective view of a circuit board of the present invention according to a first embodiment (with an enlarged view of a circled portion)

REFERENCE SIGNS LIST 2 circuit board
3 terminal block
4 bus bar block
7 relay (heat-generating component)
13 block main body
14, 14' terminals
14a, 19a terminal portions
14b terminal portion
15 terminal portion
16 each through hole
18 block main body
19 bus bar
19b terminal portion
82 metal core

DESCRIPTION OF EMBODIMENTS

Figure 2:
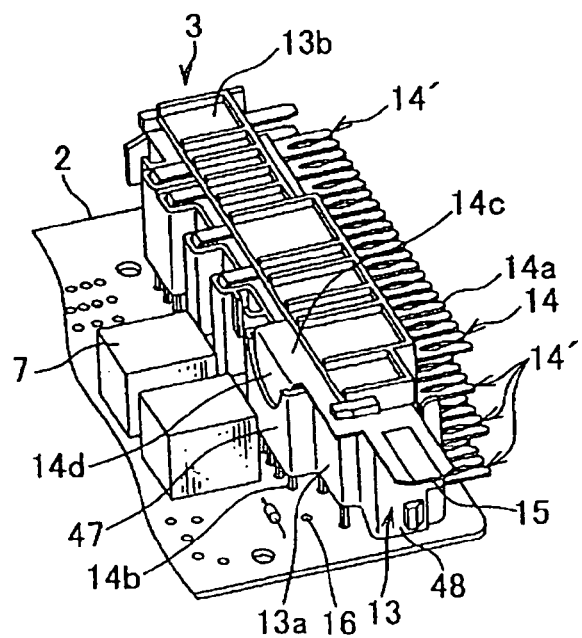
FIG. 2 is a perspective view of the first embodiment seen from a different direction.

FIG. 1 and FIG. 2 show a circuit board structure having measures against heat of the present invention according to a first embodiment.

Figure 9:
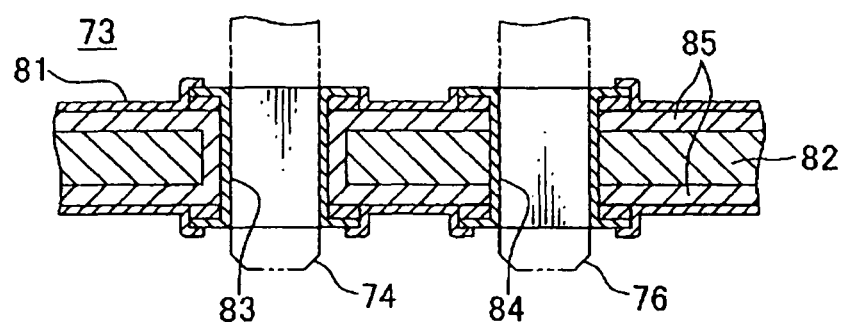
FIG. 9 is a vertical cross-sectional view of the circuit board of the prior art according to the one embodiment.

This structure includes a circuit board 2 having at an intermediate portion in a thickness direction thereof a plate-like conductive metal core (refer to a reference sign 82 in FIG. 9). A terminal block 3 is disposed at the circuit board 2. A plurality of pin-shaped terminal portions 14b is formed at a plate-like terminal (bus bar) 14 of the terminal block 3. The terminal portions 14b are inserted into respective through holes 16 of the circuit board 2 and connected by soldering so as to be in contact with a conductive portion of an inner surface of the through holes 16 of the metal core, respectively (or, the terminal portions 14b are arranged to contact with the conductive portion of the inner surface of the through holes 16 of the metal core via solder).

Since the basic structure of the metal core is similar to that of the prior art shown in FIG. 9, a detailed explanation thereof is eliminate. FIG. 1 only shows an insulating board 2a covering a top surface and a bottom face of the metal core. Dimensions of the metal core are arranged within a length and a width of the insulating board 2a. A printed circuit not shown (a pattern circuit at a surface layer) is formed with a predetermined pattern at a top face and/or a bottom face of the insulating board 2a.

The terminal block 3 includes a block main body 13 made of an insulating resin and a plurality of power supply terminals 14, 14' retained by the block main body 13. The plurality of power supply terminals 14, 14' includes: the broad plate-like terminal (bus bar) 14 having an L-shaped cross-section shown in an enlarged view; and the narrow terminals 14' having an L-shaped cross-section. The narrow terminals 14' are provided with the one or few pin-shaped terminal portions 14b. The respective terminals 14, 14' include a horizontal plate portion 14c which is parallel to the circuit board 2 and a vertical plate portion 14d which is perpendicular to the circuit board 2. The horizontal plate portion 14c includes U-shaped holding terminal portions 14a for a connection with fuses which are formed integrally with an edge (anterior edge) of the horizontal plate portion 14c. The vertical plate portion 14d includes pin-shaped terminal portions 14b for a connection with a circuit board which are formed integrally with an edge (bottom edge) of the vertical plate portion 14d.

In the present invention, the vertical plate portion 14d of the broad terminal 14 is provided with the plurality of (four, in this embodiment) pin-shaped terminal portions 14b which are arranged in parallel and alternately adjacent to each other so as to be inserted into and connected to the respective through holes of the metal core of the circuit board 2 at a time. Thus, there is provided with increased connection points forming a connection with the circuit board 2. Consequently, heat of the circuit board 2 can efficiently be absorbed and transferred to the terminal 14 by the plurality of terminal portions 14b. Furthermore, by employing the narrow terminals 14' each having two or so pin-shaped terminal portions 14b, the efficient heat spreading, i.e. heat soaking, is enhanced, as well as the efficient heat releasing.

The horizontal plate portion 14c of the broad terminal 14 is provided with a tab-like terminal portion 15 arranged to project from and continue from a lateral side of the horizontal plate portion 14c. Thus, by connecting, to the tab-like terminal portion 15, a female terminal connected to an end of an external electric wire having large diameter (not shown), the heat absorbed by the terminal 14 can efficiently be released (dissipated) to an external environment through the electric wire. The electric wire is connected for example to a battery or an alternator of a vehicle.

The respective pin-shaped terminal portions 14b of the broad terminal 14 are formed short in length. The vertical plate portion 14d is provided with a vertically long slit 14e formed at a center with respect to the four pin-shaped terminal portions 14b, so that the four pin-shaped terminal portions 14b are split two by two. The slit 14e absorbs heat strain of the vertical plate portion 14d caused by melted solder, reducing a stress at a soldered portion between the respective pin-shaped terminal portions 14b and the circuit board 2.

The horizontal plate portion 14c of the broad terminal 14 is provided with a plurality of holding terminal portions 14a arranged in parallel at an equal interval. The holding terminal portion 14a includes a right-and-left pair of elastic pieces and a slit therebetween. The holding terminal portion 14a is connected to a small blade-like fuse (not shown) having a top-and-bottom pair of tab terminals, so as the holding terminal portion 14a sandwiches one of the tab terminals of the fuse. The laterally-projecting tab terminal portion 15 is formed broad to address a relatively large current. A narrow tab terminal portion 14f arranged in parallel with the holding terminal portions 14a is provided for a connection with a box-shaped fusible link (not shown).

As shown in FIG. 2, the terminal block 3 retains the terminals 14, 14' arranged in a plurality of vertically-layered columns (four columns in this embodiment). The horizontal plate terminal 14c of the broad terminal 14 is arranged at an uppermost column. The fuses are arranged in two vertically-layered columns. The block main body 13 includes a main portion 13a and an upper cover portion 13b. The vertical plate portions 14d of the respective terminals 14, 14' are inserted in the main portion 13a downwardly from above. Then, the cover portion 13b is mounted to the main portion 13a from a tip-end side of the terminal 14, 14' to fix the terminal 14, 14'.

The vertical plate portion 14d of the broad terminal 14 is inserted into a broad recess portion 47 at a posterior wall of the main portion 13a of the block main body 13, so that the respective pin-shaped terminal portions 14b are arranged to project downwardly with respect to a bottom end of the recess portion 47. Thus, while bottom faces of side walls 48 of the main portion 13a are in contact with a surface of the circuit board 2, the respective pin-shaped terminals 14b are inserted into the respective through holes 16 of the circuit board 2 and are soldered, within the through hole, to the metal core. The number of the pin-shaped terminal portions 14b may be other than four. In fact, the more the pin-shaped terminal portions 14b are provided, the higher the thermal conductivity (heat absorption property) can be provided, i.e. the more the heat can be absorbed from the metal core of the circuit board 2.

A fuse holder (not shown) made of an insulating resin is mounted to an anterior end of the block main body 13. Thus, the respective holding terminal portions 14a projecting from the block main body 13 in an anterior direction are received in the fuse holder. Then, the respective fuses are mounted horizontally to the fuse holder from an anterior side.

As shown in FIG. 1, a plurality of relays 7 is disposed at and connected to a central portion of the circuit board 2 in a width direction, so as to be in parallel in right-and-left direction as well as in an anteroposterior direction (a longitudinal direction of the circuit board). Since the relays 7 are heat-generating components, relays 7 generate a great amount of heat causing a rise in temperature of the circuit board 2. Small resistance components 49 are disposed at and connected to the circuit board 2. The circuit board 2, the terminal block 3 and the electric and electronic components such as the relays 7 together constitute a circuit board assembly (sub-assembly) 12. In the description, direction-indicative terms such as right-and-left, top-and-bottom and anteroposterior are used for convenience and may not correspond with a direction of implementation of the circuit board assembly 12.

As one example, the block main body 13 of the terminal block 3 may be formed with a resin material having high thermal conductivity, so that heat absorbed via the terminals 14, 14' can be released efficiently also from the block main body 13 to the external environment. Such resin material having high thermal conductivity can be formed for example by mixing a resin with a filler such as metal having high thermal conductivity. Furthermore, since the bottom faces of the side walls 48 of the main portion 13a are in contact with the surface of the circuit board 2, the heat generated at an anterior portion of the circuit board 2 can be released also from the block main body 13.

Figure 3:
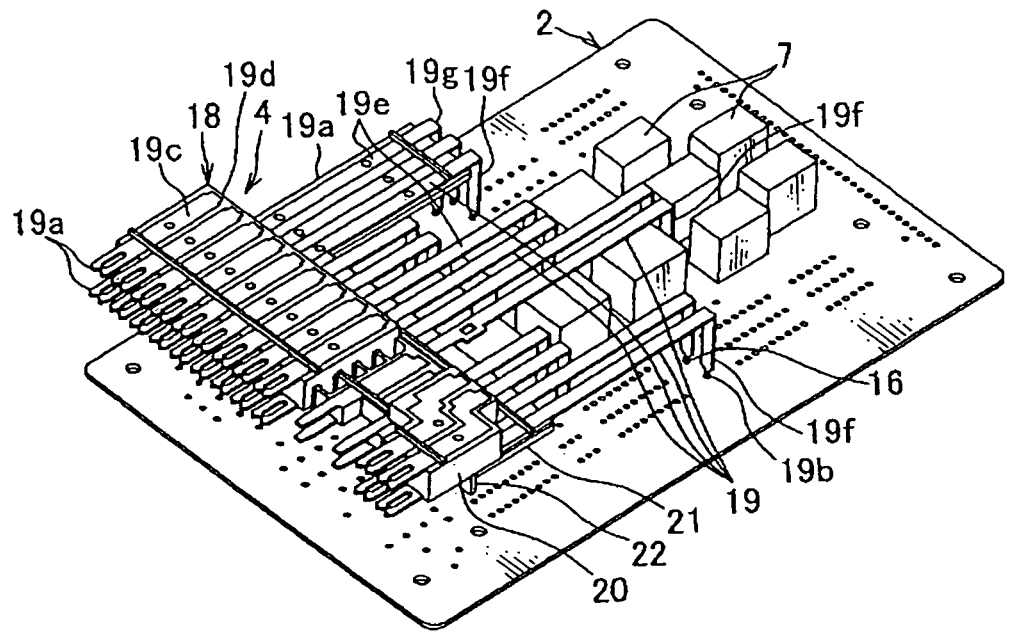
FIG. 3 is a perspective view of a circuit board of the present invention according to a second embodiment.
Figure 4:
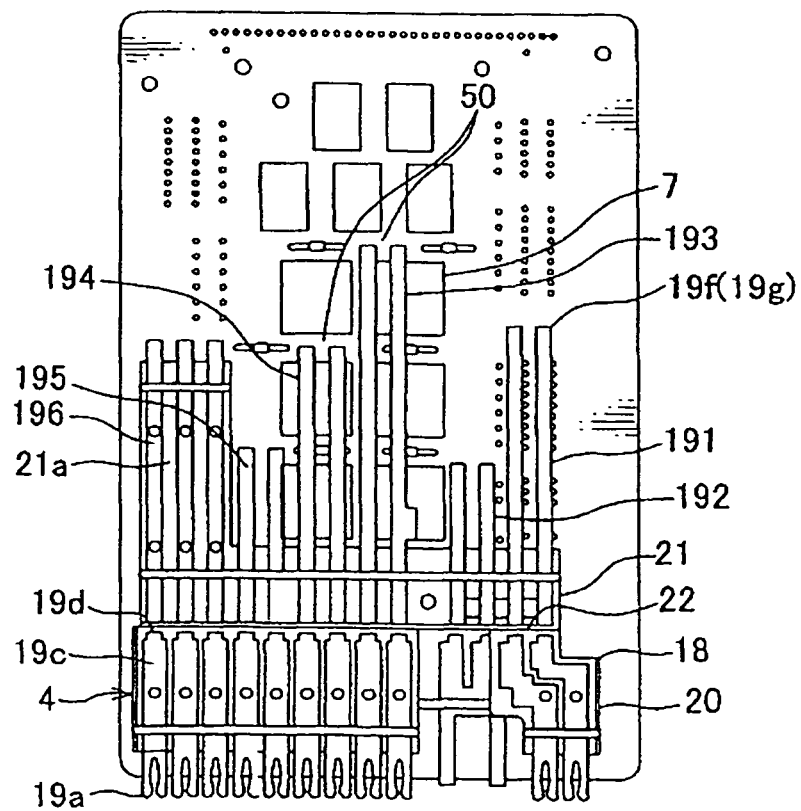
FIG. 4 is a top view of the second embodiment.
Figure 5:
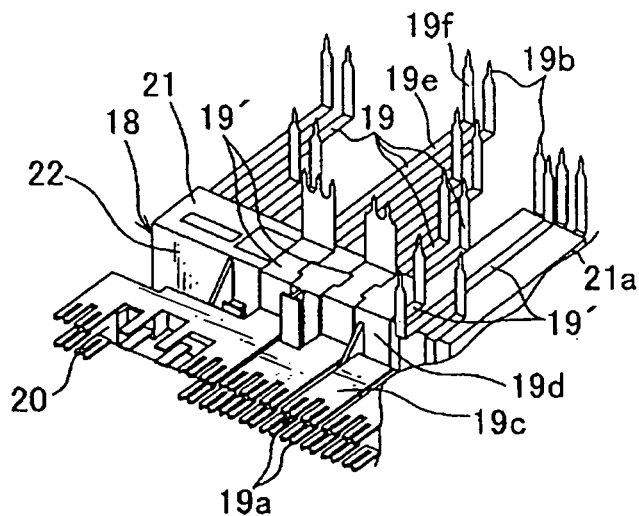
FIG. 5 is a perspective view of a bus bar block of the second embodiment seen from a back side.

FIG. 3 through FIG. 5 shows a circuit board structure having measures against heat of the present invention according to a second embodiment.

This structure includes a circuit board 2 includes: a plate-like conductive metal core at an intermediate portion in a thickness direction of the circuit board 2 (refer to a reference sign 82 in FIG. 9); and a pattern circuit (printed circuit) at a surface layer of the circuit board 2. A bus bar block 4 is disposed at the circuit board 2 and is provide with a plurality of band-like power bus bars 19 arranged in parallel. Each of the power bus bars 19 includes a horizontal portion 19e arranged in parallel with the circuit board 2, and a short vertical portion 19f extending perpendicularly from an end of the horizontal portion 19e. Pin-shaped terminal portions 19b each provided at an end (bottom end) of the respective vertical portions 19f are inserted into the respective through holes 16 of the circuit board 2. Then, each of the pin-shaped terminal portions 19b is contacted to and soldered to an inner surface of the through hole 16 of the metal core, or to an inner surface of both of the pattern circuit and the metal core (thus, the respective pin-shaped terminal portions 19b are arranged to contact, via solder, with the inner surface of the through hole 16 of the metal core or of both the pattern circuit and the metal core). The surface layers may be a top surface or a bottom surface.

The circuit board 2 is similar to that of the first embodiment shown in FIG. 1, as well as the arrangement of the components such as the relays 7. The through holes 16 into which the pin-shaped terminal portions 19b of the bus bars 19 are inserted may be formed at an arbitral portion on the circuit board 2, including a portion between the repays 7 which are adjacent to each other in an anteroposterior direction.

The bus bar block 4 includes: a block main body 18 made of an insulating resin; and a plurality of bus bars 19, 19' arranged in parallel at both sides (upper and lower) of the block main body 18, respectively. FIG. 5 shows the bus bar 19' seen from the back. Preferably, the respective bus bars 19, 19' are fixed to the block main body 18 by an insert molding. However, the respective bus bars 19, 19' may be disposed at wiring grooves (not shown) arranged in an anteroposterior direction of the block main body 18, while small projections (not shown) formed integral with the block main body 18 are inserted into respective small holes of the bus bars 19, 19' and fixed thereto by thermal caulking.

The respective bus bars 19, 19' include, at a tip end (anterior end) thereof, a holding terminal portion 19a for a connection with fuses which is shaped similar to that of the terminal 14 of FIG. 1. The respective bus bars 19, 19' further include, at a base end (bottom end at a posterior end) thereof, the pin-shaped terminal portion 19b for a connection with a circuit board which is shaped similar to that of the terminal 14 of FIG. 1.

The respective holding terminal portions 19a of the upper and lower (both sides of the block main body) bus bars 19, 19' are to be connected with a tab terminal of a fuse (not shown) by inserting the tab terminal therein. The upper bus bars 19 project (exposed) from the block main body 18 for a long distance in a posterior direction, and the lower bus bars 19' are arranged to be wired within a length of the block main body 18 in the anteroposterior direction, as shown in FIG. 5.

As shown in FIG. 3, the block main body 18 is cranked or formed into a step-like shape. The block main body 18 includes an upper anterior horizontal wall portion 20, a lower posterior horizontal wall portion 21, and a short intermediate vertical wall portion 22 connecting the both wall portions 20, 21. The vertical wall portion 22 may be arranged to extend downwardly to contact with a surface of the circuit board 2 to be supported thereby.

The respective bus bars 19, 19' are formed into a step-like shape along a figure of the block main body 18. The respective bus bars 19, 19' include an anterior horizontal portion 19c, a posterior horizontal portion 19e, a short intermediate vertical portion 19d connecting the both horizontal portions 19c, 19e, and a posterior vertical portion 19f bent downwardly from the posterior horizontal portion 19e. The respective holding terminal portions 19a are formed integrally with an anterior end of the respective anterior horizontal portions 19c. The respective pin-shaped terminal portions 19b are formed integrally with a bottom end of the respective posterior vertical portions 19f.

The respective holding terminal portions 19a project from an anterior end of the upper horizontal wall portion 20 of the block main body 18 in the anterior direction. The lower horizontal wall portion 21 of the block main body 18 includes a portion (a left-end portion) extending far in the posterior direction, and this extended wall portion 21a of the lower horizontal wall portion 21 insulates the respective upper and lower bus bars 19, 19' arranged long along and arranged at the both sides of the extended-wall portion 21a. The lower bus bars 19' other than the ones arranged at the extended-wall portion 21a are formed short. The upper bus bars 19 other than the ones arranged at the extended-wall portion 21a are formed long in the anteroposterior direction across the entire width of the block main body 18.

As shown in FIG. 4, the upper bus bars 19 are divided into bus bar groups 191 through 196, each group having a different bus bar length. The bus bar group 191 at a right end include long bus bars, the bus bar group 192 second from the right end include short bus bars, the bus bar group 193 third from the right end include longest bus bars, the bus bar group 194 fourth from the right end include long bus bars, the bus bar group 195 fifth from the right end includes short bus bars, and the bus bar group 196 at a left end includes long bus bars arranged along the extended-wall portion 21a. The respective bus bar groups 191 through 196 include two or three bus bars 19 having the posterior horizontal portions 19e equal in length, and the posterior vertical portions 19f (and having bent positions 19g of the respective vertical portions 19f at the same position).

By differentiating the bus bar lengths for the respective bus bar groups 191 through 196, some or all of the bus bar groups 191 through 196 can be connected to the metal core of the circuit board 2 over a wide area of the circuit board 2 in a longitudinal direction of the circuit board 2. Consequently, the heat of the circuit board 2 can efficiently be absorbed at a plurality of sites in length and width of the metal core and by the bus bar groups 191 through 196. Thus, the heat of the circuit board 2 can be spread and released to the external environment from an outer surface of the respective bus bars 19. Other some of the bus bar groups 191 through 196 are connected to the pattern circuit at the surface layer of the circuit board 2. Thus, the heat of the circuit board 2 can efficiently be absorbed at one site or at a plurality of sites of the pattern circuit by the bus bar groups 191 through 196. Consequently, the heat of the circuit board 2 can be spread and released to the external environment from the outer surface of the respective bus bars 19.

For the respective bus bar groups 193, 194 which are the third and the fourth groups from the right end, the horizontal portions 19e extend above the respective relays 7 disposed on the circuit board 2, while the vertical portion 19f extends downwardly towards the circuit board 2 nearby the relay 7 so the vertical portion 19f extends in a space (a space 50) provided between the repays 7 adjacent to each other in the anteroposterior direction, and the pin-shaped terminal portions 19b are inserted into and connected to the respective through holes 16 of the circuit board 2, respectively.

As described above, the pin-shaped terminal portions 19b of the bus bars 19 are connected to the metal core or to both the pattern circuit and the metal core of the circuit board 2 nearby the heat-generating relays 7. Consequently, the heat of the repays 7 can efficiently be absorbed by the bus bars 19, preventing excessive heating of the relays 7 and the circuit board 2.

Furthermore, the block main body 18 of the bus bar block 4 may be formed with a resin material having high thermal conductivity as the above-described terminal block 3, to allow the heat absorbed by the bus bars 19 to be released efficiently also from the block main body 18 to the external environment.

Advantageously, the bus bars 19 are formed with a material having higher electric conductivity to improve heat releasing property. Such resin material having high thermal conductivity can be formed for example by adding silver and such to copper, or by reducing an additive amount of Sn or Mg.

Figure 6A:
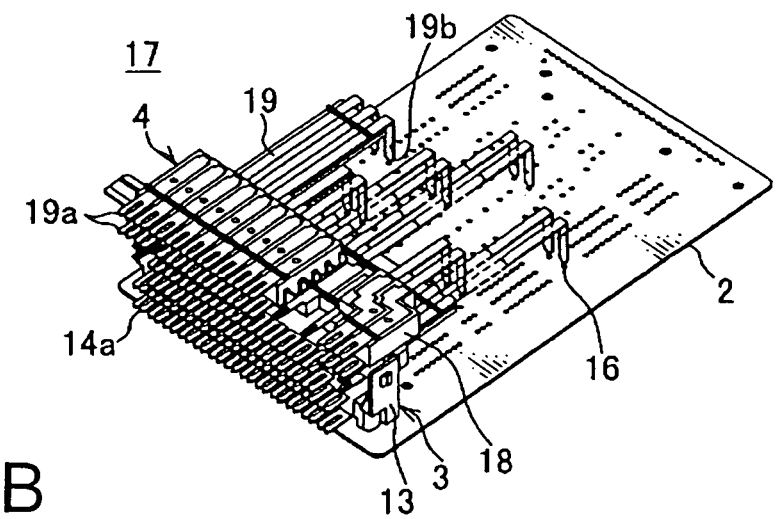
FIG. 6A is a perspective view of a circuit board of the present invention according to a third embodiment.
Figure 6B:
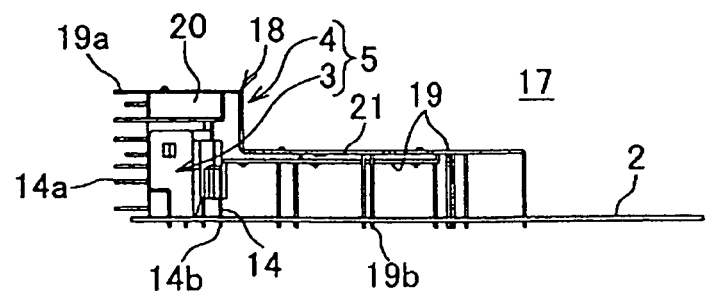
FIG. 6B is a side view of FIG. 6A.

FIGS. 6A and 6B show a circuit board structure having measures against heat of the present invention according to a third embodiment. This structure is a combination of the embodiments shown in FIG. 1 and FIG. 3.

That is, in FIGS. 6A and 6B, the terminal block 3 of the FIG. 1 is disposed on a surface of a circuit board 2, and the bus bar block 4 of FIG. 3 is disposed on the terminal block 3. The upper anterior horizontal wall portion 20 of the bus bar block main body 18 is provided on the terminal block main body 13 so that the bottom face of the horizontal wall portion 20 is in contact with the upper cover 13b of the terminal block main body 13. The pin-shaped terminal portions 14b of the terminal 14 of the terminal block 3 and the pin-shaped terminal portions 19b of the bus bars 19 of the block 4 are inserted respectively into the through holes 16 of the circuit board 2 and connected thereto by soldering. The respective pin-shaped terminal portions 14b, 19b of the terminal 14 and the bus bars 19 are in contact with the metal core, or with both the pattern circuit and the metal core, over a wide area of the circuit board 2. Consequently, the heat of the circuit board 2, i.e. the metal core and the pattern circuit, can efficiently and uniformly be absorbed by the terminal 14 and the bus bars 19, spreading and releasing the heat.

The respective holding terminal portions 14a, 19a of the terminal 14 and the bus bars 19 are arranged in a plurality of vertically-layered columns (six columns in this embodiment). A fuse holder (not shown) is mounted to the respective block main bodies 13, 18 from an anterior side, so that the respective holding terminal portions 14a, 19a are received in respective rooms of the fuse holder. Then the fuses (not shown) are mounted to the respective rooms from the anterior side so that the fuses are arranged in three columns. Thus, the respective holding terminal portions 14a, 19a are inserted and connected to the tab terminal of the respective fuses, forming a fuse block (a power block) 5. The circuit board 2, the terminal block 3 and the bus bar block 4 together constitute a circuit board assembly (a sub-assembly) 17.

Figure 7:
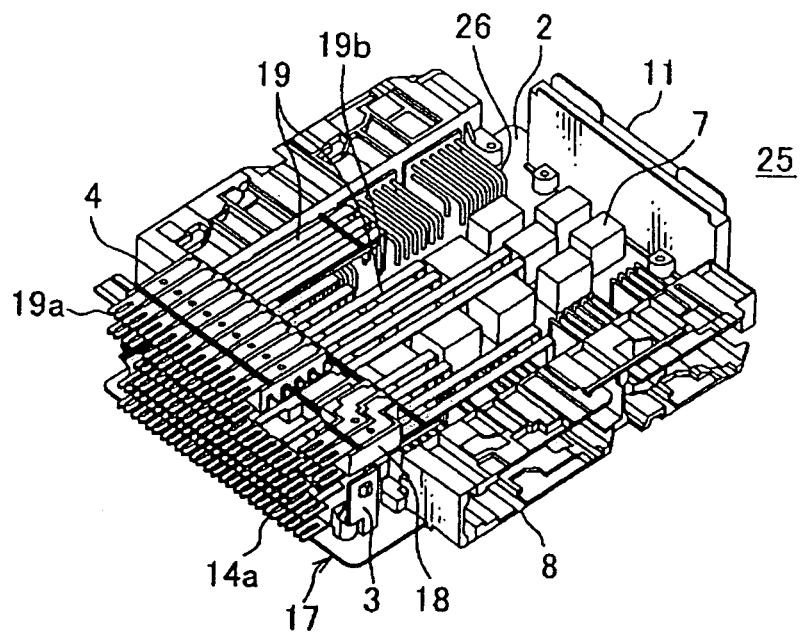
FIG. 7 is a perspective view of a finished circuit board assembly according to one embodiment.
Figure 8:
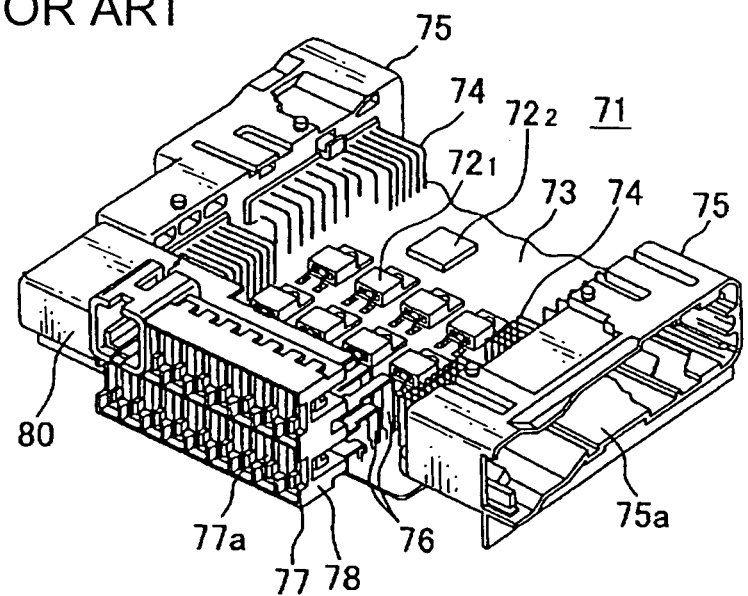
FIG. 8 is a perspective view of a circuit board assembly of a prior art according to one embodiment.

FIG. 7 shows one embodiment of a finished circuit board assembly 25 in which relays 7, connector blocks 8 and a connector 11 are connected to the circuit board assembly 17 of FIG. 6A.

The bus bar block 4 and the terminal block 3, together as the fuse block, are arranged one on the other and are disposed at the anterior portion of the circuit board 2. The connector blocks 8 are disposed at both right-and-left sides of the circuit board 2. The connector 11 for a connection with a control unit is disposed at the posterior portion of the circuit board 2. The relays 7 are disposed at inside with respect to L-shaped terminals 26 projecting from the right-and-left connector blocks 8. The circuit board assembly 25 is covered with top-and-bottom covers (not shown) made of an insulating resin to constitute a junction block.

Although in the above-described embodiments the terminal 14 and the bus bars 19 are used for a connection with the fuses, electric components other than the fuses, for example fusible links or relays, can be used. In this case, the terminals and the bus bars may be provided for example with tab terminals instead of the holding terminal portions 14a, 19a.

Furthermore, in the above-described embodiment of the FIG. 1, the terminal 14 is provided with the plate-like tab terminal portion 15 as a terminal portion for a connection with an electric wire. However, the terminal 14 can be provided with a female-type terminal portion (not shown) instead of the tab terminal portion. In addition, an electric wire having a terminal (not shown) can be connected using a bolt and a nut instead of using a connector.

Furthermore, in the above-described embodiment of the FIG. 3, the bus bar block 4 is formed into the step-like shape (is cranked). However, the shape of the bus bar block 4 can be other than the step-like shape, and it is possible to use a linear (plate-like) block main body (18) and linear bus bars (19) and dispose the block main body (18) directly on a surface of the circuit board 2.

INDUSTRIAL APPLICABILITY

A problem of a deformation of the circuit board due to heating caused by the electric and electronic components used (for example, the relays), as well as a problem of the heating being enhanced when the fuses are arranged in several columns, can be solved by increasing the connection points at which the terminals connect with the metal core of the circuit board.

The invention claimed is:

1. A circuit board structure having measures against heat, comprising,
    a terminal block having an insulating block main body and a plurality of terminals,
        wherein at least one of the terminals is provided with a plurality of terminal portions for a connection with a circuit board,
        wherein the plurality of terminal portions are inserted into respective through holes of the circuit board, the circuit board having a conductive metal core at an intermediate portion in a thickness direction of the circuit board,
        wherein heat of the metal core is absorbed and transferred to the terminals via the plurality of terminal portions, and
        wherein at least one of the terminals includes u-shaped holding terminal portions that connect integrally with an anterior edge of a horizontal plate portion and a vertical plate portion that includes pin shaped portions that connect with the circuit board and are formed integrally with a bottom edge of the vertical plate portion.

2. The circuit board structure having measures against heat according to claim 1, wherein the at least one of the terminals is provided with a terminal portion for a connection with an electric wire, so that the heat is transferred from the terminal portion to the electric wire.

3. The circuit board structure having measures against heat according to claim 1, wherein the block main body is made of a resin material having a high thermal conductivity.

* * * * *